(12) United States Patent
Livesay

(10) Patent No.: US 6,407,399 B1
(45) Date of Patent: Jun. 18, 2002

(54) UNIFORMITY CORRECTION FOR LARGE AREA ELECTRON SOURCE

(75) Inventor: William R. Livesay, San Diego, CA (US)

(73) Assignee: Electron Vision Corporation, San Diego, CA (US)

(*) Notice: Subject to any disclaimer, the term of this patent is extended or adjusted under 35 U.S.C. 154(b) by 0 days.

(21) Appl. No.: 09/408,926

(22) Filed: Sep. 30, 1999

(51) Int. Cl.$^7$ .................................................. H01J 37/30
(52) U.S. Cl. ....................................... 250/492.3; 250/398
(58) Field of Search ................................. 250/492.3, 398

(56) References Cited

U.S. PATENT DOCUMENTS

| | | | | |
|---|---|---|---|---|
| 3,852,633 A | | 12/1974 | Hunter | 313/411 |
| 4,694,222 A | * | 9/1987 | Wakalopulos | 315/111.21 |
| 5,003,178 A | * | 3/1991 | Livesay | 250/492.3 |
| 5,563,418 A | * | 10/1996 | Leung | 250/492.3 |

FOREIGN PATENT DOCUMENTS

| | | | |
|---|---|---|---|
| JP | 09166700 | * | 6/1997 |
| WO | WO 90/05990 | | 5/1990 |

OTHER PUBLICATIONS

Japanese Publication No.: 09166700, Publication Date: Jun. 23, 1997, Nissin High Voltage Co., Ltd., Inventor: Nishikimi Toshiro (abstract only).

Japanese Publication No.: 61183859, Publication Date: Aug. 16, 1986, Nisshin Haiboruteeji KK, Inventor: Mizusawa Kenichi (abstract only).

* cited by examiner

Primary Examiner—Bruce Anderson
(74) Attorney, Agent, or Firm—Roberts & Mercanti, LLP

(57) ABSTRACT

The invention pertains to electron exposure equipment useful for exposing, treating and processing coatings and other materials by a cold cathode gas discharge electron source having a broad uniform emitting area. The apparatus has a vacuum chamber; a large surface area cathode in the vacuum chamber and means for applying a negative voltage to the cathode and causing the cathode to issue electrons toward a target in the vacuum chamber. An anode is positioned between the cathode and the target. The anode is formed of an electrically conductive grid having an array of apertures therethrough extending from a center of the grid to an edge of the grid. In one embodiment the apertures have a progressively increasing area from the center of the grid to the edge of the grid. In another embodiment the anode has a progressively decreasing thickness from the center of the grid to the edge of the grid. In yet another embodiment the anode has both progressively increasing area from the center of the grid to the edge of the grid and a progressively decreasing thickness from the center of the grid to the edge of the grid. A voltage is applied to the anode which is positive relative to the voltage applied to the cathode.

17 Claims, 4 Drawing Sheets

UNIFORMITY CORRECTION FOR LARGE AREA ELECTRON SOURCE

BACKGROUND OF THE INVENTION

1. Field of the Invention

The present invention pertains to electron exposure equipment useful for exposing, treating and processing coatings and other materials. More specifically, the invention relates to a cold cathode gas discharge electron source having a broad uniform emitting area.

2. Description of the Related Art

In the development of many processes for treating materials, especially in producing semiconductor devices, there is a need for a broad electron beam exposure area. In this regard, a need exists in the art for a large-area electron beam source which is controllable, uniform, insensitive to poor vacuum and long lived. Such electron beams are used for curing interlayer dielectrics for microelectronic devices, photoresist exposure, altering solubility characteristics of thin film layers, and the like. These processes require an electron beam source which can be controlled in voltage and current, and can withstand the outgassing of the material being irradiated. In the past, electron beam sources used to treat large volumes of materials have typically been isolated by means of a vacuum window to protect the electron emitting cathode from outgases from the material being treated. Due to the difficulty of making large-area, electron permeable vacuum windows, these systems have utilized a small scanning beam which is then raster scanned to uniformly expose larger areas. To achieve higher throughput processing, it is advantageous to use a large-area or flood beam electron source, to expose the whole substrate simultaneously, rather than raster scanning.

Large-area thermionic cathodes are known, however these require a good vacuum environment to be long lived, and also generate an excess of heat, which can adversely affect the material being processed. For processes in which the substrate is temperature sensitive, a cold cathode is desirable. Cold cathode electron sources are also known. An electron beam system utilizing a large-area gas discharge source is described in U.S. Pat. No. 4,496,449. U.S. Pat. No. 4,119,688 describes a pulsed glow discharge system, with which it is difficult to attain uniform exposure and precise dose control. Another large-area cathode, based on photoemission, is disclosed in U.S. Pat. No. 4,554,458, However, photocathodes are easily poisoned and require an ultraclean high vacuum environment.

It will be appreciated from the foregoing that there is a significant need for an improved electron source that will overcome many of the disadvantages of the aforementioned earlier electron beam sources. In particular, what is needed is a broad area, uniform, cold, electron beam source with continuously variable voltage, capable of operation in a soft vacuum. Ideally, the electron source should also have a continuously variable accelerating voltage that can be utilized to rapidly process large-area substrates in semiconductor device fabrication for high resolution shadow mask lithography, photoresist curing or hardening, blanket exposure of resists for aiding liftoff processes, enhancing resist contrast or controlling resist pattern dimensions or pattern edge profiles and to provide a highly uniform e-beam flux to provide consistent results to the treated film.

U.S. Pat. No. 5,003,178, which is incorporated herein by reference, describes a large area uniform electron source which provides a fairly uniform electron beam over large areas. It has been found in the application of this apparatus and the further development of integrated circuit processes, that a higher degree of uniformity is required to meet the needs of next generation microelectronic devices. In the generation of an electron beam as described in U.S. Pat. No. 5,003,178, there a fall-off in beam intensity from the center to the edge of the source. This fall-off, which is on the order of 25–30%, is caused by a lower density of ions on the periphery of the beam. This results in a non-uniformity in the exposure of a target by the beam. In the device of U.S. Pat. No. 5,003,178, there is an anode between the cathode and the target substrate which separates the cathode and the accelerating field from the target. The anode has a uniform density of holes in this anode grid. The present invention discloses methods for correcting beam intensity fall-off from the center to the edge. As a result a uniformity of better than ±2.5% over the full emitting area of the source can be attained.

SUMMARY OF THE INVENTION

The invention provides an electron emission apparatus, comprising:
 (a) a vacuum chamber;
 (b) a large surface area cathode in the vacuum chamber;
 (c) means for applying a negative voltage to the cathode and causing the cathode to issue electrons toward a target in the vacuum chamber;
 (d) an anode spaced apart from the cathode and positioned between the cathode and the target; said anode comprising an electrically conductive grid having an array of spaced apart apertures therethrough extending from a center of the grid to an edge of the grid; said apertures having progressively increasing area from the center of the grid to the edge of the grid; and
 (e) means for applying a voltage to the anode which is positive relative to the voltage applied to the cathode.

The invention also provides an electron emission apparatus, comprising:
 (a) a vacuum chamber;
 (b) a large surface area cathode in the vacuum chamber;
 (c) means for applying a negative voltage to the cathode and causing the cathode to issue electrons toward a target in the vacuum chamber;
 (d) an anode spaced apart from the cathode; and positioned between the cathode and the target; said anode comprising an electrically conductive grid having a progressively decreasing thickness from a center of the grid to an edge of the grid; and having an array of spaced apart apertures therethrough extending from the center of the grid to the edge of the grid; and
 (e) means for applying a voltage to the anode which is positive relative to the voltage applied to the cathode.

The invention further provides an electron emission apparatus, comprising:
 (a) a vacuum chamber;
 (b) a large surface area cathode in the vacuum chamber;
 (c) means for applying a negative voltage to the cathode in an amount sufficient to drive electrons toward a target in the vacuum chamber;
 (d) an anode spaced apart from the cathode and positioned between the cathode and the target; said anode comprising an electrically conductive grid having an array of spaced apart apertures therethrough extending from a center of the grid to an edge of the grid; said apertures having progressively increasing area from the center of the grid to the edge of the grid; and (e) means for applying a voltage to the anode which is positive relative to the voltage applied to the cathode; and (f) means for generating electrons between the cathode and the anode.

The invention still further provides an electron emission apparatus, comprising:

(a) a vacuum chamber;

(b) a large surface area cathode in the vacuum chamber;

(c) means for applying a negative voltage to the cathode in an amount sufficient to drive electrons toward a target in the vacuum chamber;

(d) an anode spaced apart from the cathode; and positioned between the cathode and the target; said anode comprising an electrically conductive grid having a progressively decreasing thickness from a center of the grid to an edge of the grid; and having an array of spaced apart apertures therethrough extending from the center of the grid to the edge of the grid; and (e) means for applying a voltage to the anode which is positive relative to the voltage applied to the cathode; and (f) means for generating electrons between the cathode and the anode.

The invention further provides a charged particle emission apparatus, comprising:

(a) a vacuum chamber;

(b) a first electrode capable of directing charged particles in the vacuum chamber;

(c) means for applying a voltage to the cathode and causing the first electrode to direct charged particles toward a target in the vacuum chamber;

(d) a second electrode spaced apart from the first electrode and positioned between the first electrode and the target; said second electrode comprising an electrically conductive grid having an array of spaced apart apertures therethrough extending from a center of the grid to an edge of the grid; said apertures having progressively increasing areas from the center of the grid to the edge of the grid; and (e) means for applying a voltage to the second electrode which attracts the charged particles directed by the first electrode.

The invention still further provides a charged particle emission apparatus, comprising:

(a) a vacuum chamber;

(b) a first electrode capable of directing charged particles in the vacuum chamber;

(c) means for applying a voltage to the cathode and causing the first electrode to direct charged particles toward a target in the vacuum chamber;

(d) a second electrode spaced apart from the first electrode and positioned between the first electrode and the target; said second electrode comprising an electrically conductive grid having a progressively decreasing thickness from a center of the grid to an edge of the grid; and having an array of spaced apart apertures therethrough extending from the center of the grid to the edge of the grid; and (e) means for applying a voltage to the second electrode which attracts the charged particles directed by the first electrode.

The invention still further provides a method for producing a highly uniform electron beam emission, comprising:

(a) applying a negative voltage to a large-area cathode positioned in a vacuum chamber, to direct electrons in the vacuum chamber toward a target in the vacuum chamber;

(b) applying a voltage to an anode spaced apart from the cathode and positioned between the cathode and the target, which voltage is positive relative to the voltage applied to the cathode; said anode comprising an electrically conductive grid having an array of spaced apart apertures therethrough extending from a center of the grid to an edge of the grid; said anode having one or both of (i) and (ii):

(i) apertures having progressively increasing area from the center of the grid to the edge of the grid;

(ii) a progressively decreasing thickness from a center of the grid to an edge of the grid.

The invention still further provides a method for producing a highly uniform charged particle emission comprising:

(a) applying a voltage to a large-area cathode positioned in a vacuum chamber and causing the first electrode to direct charged particles toward a target in the vacuum chamber;

(b) applying a voltage to a second electrode spaced apart from the first electrode and positioned between the first electrode and the target; which voltage attracts the charged particles directed by the first electrode; said second electrode comprising an electrically conductive grid having an array of spaced apart apertures therethrough extending from a center of the grid to an edge of the grid; said second electrode having one or both of (i) and (ii):

(i) apertures having progressively increasing area from the center of the grid to the edge of the grid;

(ii) a progressively decreasing thickness from a center of the grid to an edge of the grid.

DETAILED DESCRIPTION OF THE PREFERRED EMBODIMENT

The apparatus of the invention provides a cold cathode gas discharge or charged particle source with a large emission area, for example, a one to twenty four inch wide electron or charged particle source that can be controlled rapidly and accurately with an easily adjustable low bias voltage. Such bias voltages may be, for example, from 0 to 150 volts, to provide a device that is continuously variable in accelerating voltage without requiring large variations in operating vacuum level.

In the preferred embodiment, a large-area electron source is capable of operation continuously, stable, and indefinitely in a poor vacuum environment. The electron source utilizes a glow discharge cathode with an intermediate grid anode between the cathode and a target to which the electrons are directed. Electron emission from the cathode can be controlled with a low voltage applied to the grid and the accelerating voltage on the cathode can be varied continuously from a few hundred volts to 30 Kv or greater.

Figure 1:
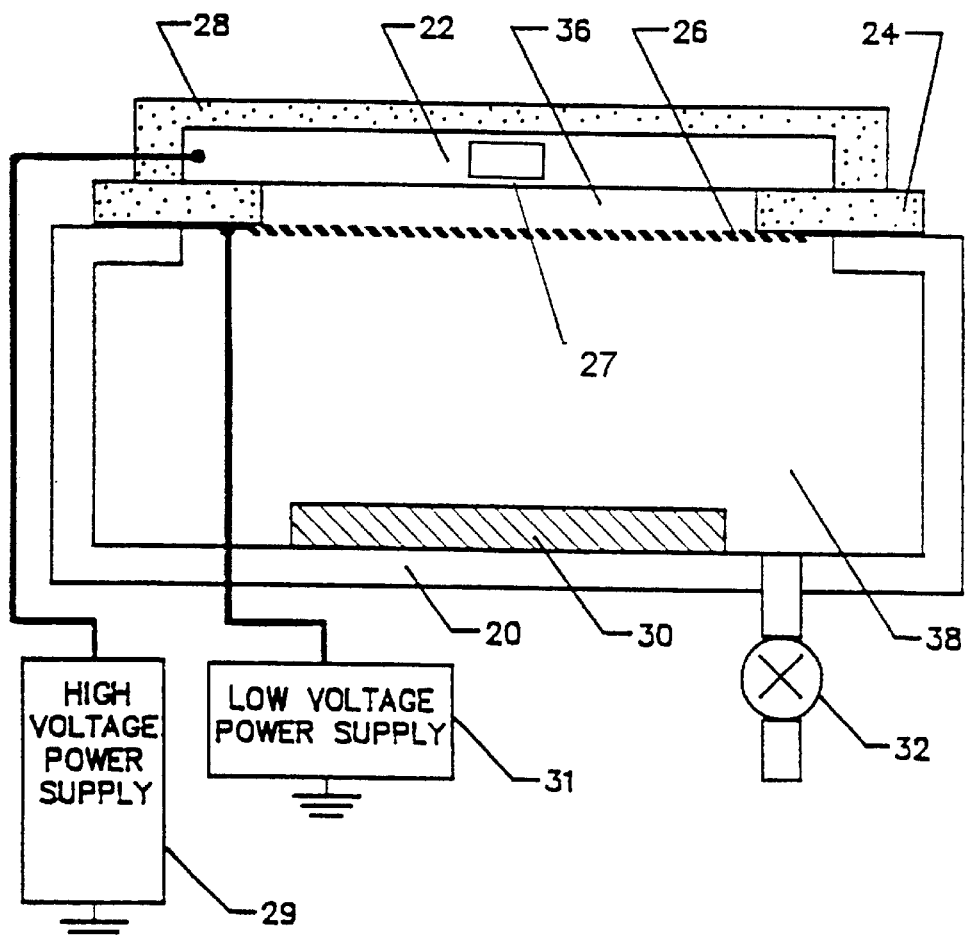
FIG. 1 is an elevational view showing an electron beam exposure apparatus according to the invention.

Referring to FIG. 1, there is shown a cold cathode gas discharge electron source including a vacuum chamber, 20, a large-area cathode 22, a target or substrate 30, located in a field-free region 38, and a grid anode 26 positioned between the target 30 and cathode 22, preferably at a distance from the cathode that is less than the mean free path length of electrons emitted from the cathode can be varied over a wide range by varying the bias voltage applied to the grid 26.

The apparatus further includes a high voltage insulator 24, which isolates the grid 26 from the large-area cathode 22, a cathode cover insulator 28 located outside the vacuum, a variable leak valve 32 for controlling the pressure inside the vacuum chamber 20, a variable high voltage power supply 29 connected to the cathode 22, and a variable low voltage 0 to 100 volt power supply 31 connected to the grid 26.

In operation, the substrate to be exposed with the electron beam is placed on the target plane 30, and the vacuum chamber 20 is pumped from atmospheric pressure to a pressure in the range of 1 to 200 millibar. The exact pressure is controlled via the variable rate leak valve 32, which is capable of controlling pressure to ±1 millibar. The high voltage, i.e. a negative voltage of from about 500 volts to about 30,000 volts or higher, at which the exposure is to take place is applied to the cathode 22 via the high voltage power supply 29. Suitable means for applying a negative voltage to the cathode include a Bertan Model #105-30R high voltage power manufactured by Bertan of Hickville, N.Y., or a Spellman Model #SL30N-1200X 258 available from Spellman High Voltage Electronics Corp., of Hauppauge, N.Y.

Figure 2:
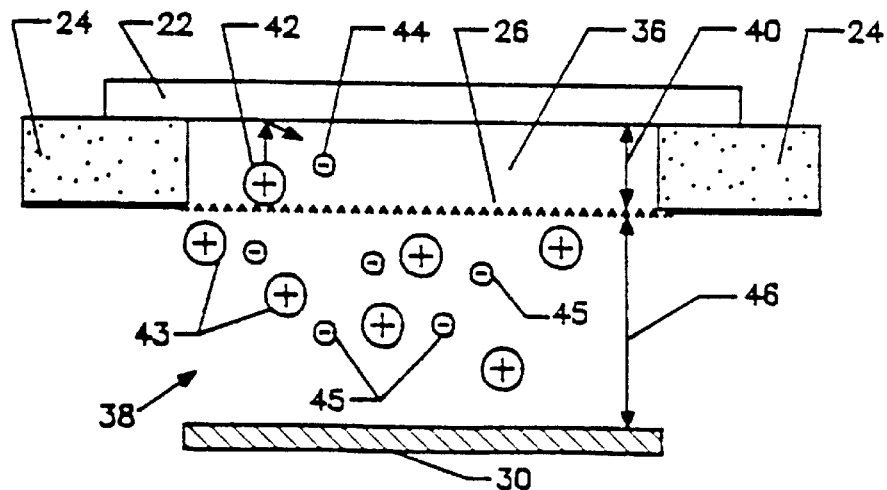
FIG. 2 is a fragmentary view of the electron beam exposure apparatus according to the invention schematically showing some of the details of operation.

A variable voltage source 31, which may be, for example, a d.c. power supply capable of sourcing or sinking current, is also applied to the anode 26. A suitable means for applying a voltage to the anode which is positive relative to the voltage applied to the cathode is an Acopian Model #150PT12 Power Supply available from Acopian of Easton, Pa. The voltage on the grid is utilized to control electron emission from the cathode, as will now be described with reference to FIG. 2.

To initiate electron emission, the gas in the space between the cathode 22 and the target 30 must become ionized. This occurs as a result of naturally occurring gamma rays, or emission can instead be initiated artificially inside the chamber by a high voltage spark gap. Once this initial ionization takes place, positive ions 43 are attracted to the grid 26 by a slightly negative voltage, on the order of about 0 to about −80 volts, applied to the grid 26. These positive ions 42 pass into the accelerating field region 36 between the cathode 22 and the anode 26 and are accelerated towards the cathode surface 22 as a result of the high voltage applied to the cathode, i.e. from about −500 to about −30,000 volts. Upon striking the cathode surface these high energy ions produce secondary electrons 44 which are accelerated back toward the grid 26. Some of these electrons, which are now traveling mostly perpendicular to the cathode surface, strike the anode structure 26 but many pass through the grid and continue on to the target 30. These high energy electrons ionize the gas molecules in the space between the grid 26 and the target 30.

The grid 26 is preferably placed at a distance less than the mean free path of the electrons emitted by the cathode. Therefore no significant ionization takes place in the accelerating field region 36 between the grid and the cathode. In a conventional gas discharge device the electrons emitted would create further positive ions in the accelerating field region and all of these ions would be accelerated back to the cathode creating even more electron emission and the discharge could easily avalanche into an unstable high voltage breakdown. However, in this invention, the ions 42 created outside the grid are controlled (repelled or attracted) by the voltage applied to the grid 26. Thus, the electron beam current emission can be continuously controlled from very small currents to very large currents by varying the voltage on the grid. Alternatively, the electron emission can be controlled by means of the variable leak valve 32, which can raise or lower the number of molecules in the ionization region between the target and cathode. However, due to the slow response time of adjusting the pressure in the chamber, it is more advantageous to adjust the pressure initially to produce some nominal emission current and then utilize the bias voltage on the grid 26 to rapidly and precisely control emission current.

The electron emission can be turned off entirely by applying a positive voltage to the grid 26, such that the positive grid voltage exceeds the energy of any of the positive ion species created in the space between the grid 26 and target 30. It has been found that the grid can be located a distance less than 4 mm from the cathode. This distance is preferably less than the mean free path of electrons for the lowest voltage of interest (500 volts) and preferred operating vacuum pressure level. The preferred operating vacuum level of this invention is in the region of highest electrical dielectric strength. Therefore, even though the grid-to-cathode gap must by necessity be very small to be less than the mean free path determined by the lowest desired operating accelerating voltage, the system is operated at a vacuum level where the breakdown strength of the vacuum exceeds the field created by the highest operating voltage applied across the selected grid-to-cathode spacing. This low or soft vacuum level (20 to 80 millitorr) is easily achieved by inexpensive mechanical vacuum pumps and allows the cathode 22 and target 30 to be placed in close proximity to each other in the same vacuum environment.

This mechanism of ion bombardment induced electron emission maintains a clean and uniform emitting cathode surface. Although this continual ion bombardment causes erosion of the cathode surface due to sputtering, by utilizing a low sputtering yield cathode material, such as aluminum, the cathode can be operated continuously for many thousands of hours without requiring replacement.

Figure 3:
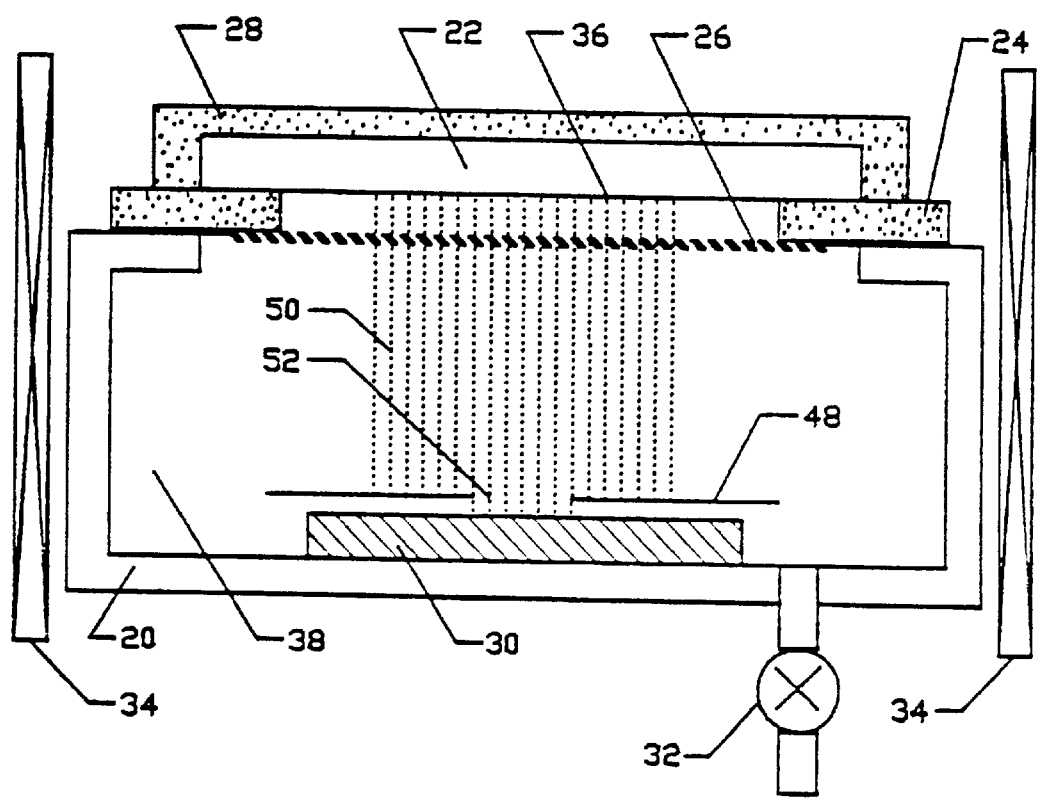
FIG. 3 is a view similar to FIG. 1 showing use of the invention in shadow mask lithography.

The electrons emitted from the cathode 22 are accelerated to the grid 26 and are mostly traveling perpendicular to the grid and cathode surface. Some emitted electrons are intercepted by the grid and some are scattered by the grid. If the target 30 is within a few millimeters of the grid, the electrons will cast an image of the grid on the target. However, if the target is placed at a large distance 46, such as 10 to 20 centimeters from the grid, the electron beam diffuses, due to initial transverse velocities and scattering, to a fairly uniform current density across the whole emitting area. The irradiation of the target can be made even more uniform by sweeping the beam back and forth across the target by means of a time-varying magnetic field produced by deflection coils 34 surrounding the exposure chamber, as shown in FIG. 3.

The invention can also be used for shadow mask lithography. An aperture plate or mask 48 is placed between the grid 26 and in contact or close proximity with the target 30, as shown in FIG. 3. Since the electrons moving toward the target 30 are nearly collimated by the accelerating field, as indicated at 50, and have relatively small transverse velocities, a shadow mask, such as the plate 48, placed in close proximity to the target will be accurately replicated by the electron beam 52 that is allowed to pass through the mask or aperture plate. In this way patterned lithography can be performed using the principle of the invention.

Figure 4:
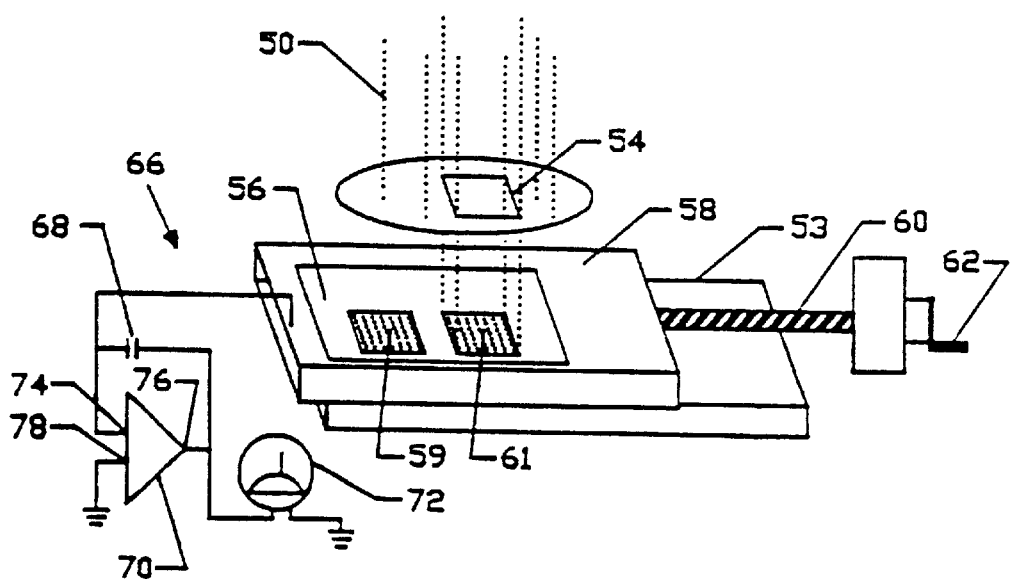
FIG. 4 is a schematic view of the invention in used as an exposure tool for determining resist sensitivity.

The invention can also be used as a resist sensitivity tool as shown in FIG. 4. A shaped aperture 54 is placed between the grid and target. This aperture can form a small shaped electron beam having a uniform current density. The target material is then scanned or stepped under the beam to generate multiple patterns in an electron sensitive resist coated on the substrate or target. The electron beam passes through the shaped aperture 54 and impinges on a target substrate, indicated at 56 in FIG. 4, which is mounted on a movable slide 58. After exposing a square feature 59 of the substrate 56, the slide 58 is moved by means of a leadscrew drive 60 and crank 62. The crank motion is coupled into the vacuum system by a suitable rotary mechanical vacuum feedthrough (not shown). The substrate 56 is moved over enough to expose a new area of resist 61. Multiple exposures are made at different selected exposure doses and accelerating voltages. This technique is very useful tool in evaluating the sensitivity of resist. By exposing a series of square patterns across a substrate, with each square having a slightly different level of exposure, resist sensitivity curves can be quickly established. Prior to the present invention, this could only be done with a very expensive electron beam lithography system. In this application, it is important to provide a very precise and uniform exposure in each feature exposed. It has been found by deflecting the beam above the aperture, utilizing magnetic deflection coils 34, that more uniform exposures can be achieved. The deflection coils scan different portions of the cathode emitting area over the pattern forming aperture, thereby averaging any nonuniformities in cathode emission. Since the aperture size is known, the exposure dose is determined with a simple electronic integrator 66, which measures the total integrated current reaching the substrate. The substrate is electrically connected to the integrator, which includes a capacitor 68, operational amplifier 70, and voltmeter 72. The current collected by the substrate tends to charge the capacitor 68 through a feedback loop. The inverting input 74 of the operational amplifier 70 is a virtual ground referenced to the non-inverting input 78. The voltage at the amplifier output 76 is related to the dose by the expression D=EC/A, where D is the exposure dose in Coulombs per square centimeter, E is the voltage at the output 76, C is the capacitance in Farads of the capacitor 68, and A is the area in square centimeters of the aperture 54. The advantage of this method of dose control is that it measures actual dose in real time. In conventional electron beam lithography systems, the exposure dose is indirectly determined by the time of exposure and independent measurement of beam current before or after the actual exposure.

Another application of this invention is resist curing. In semiconductor fabrication after pattern lithography has been performed, a resist layer must be hardened or cured prior to etching. Conventional practice utilizes baking of the resist to a high temperature. However, at these elevated temperatures the resist melts slightly and the pattern areas become distorted. Electron beam exposure of the resist provides a nonthermal means of crosslinking and hardening the resist. The substrate stays at room temperature yet the resulting exposed resist is fully crosslinked without pattern flow. With this invention, resist curing can be faster than ultraviolet curing or baking and results in a tougher resist film. In addition the electron beam can cure very thick resists, up to 20 micrometers at 30 KeV, which cannot be cured using ultraviolet curing systems. The ultraviolet radiation is absorbed in surface layers of the resist. Heretofore, electron beam curing of resist has not been widespread, due to the cost and time required by conventional electron beam lithography systems. With this approach, using an inexpensive electron source as described, electron beam curing becomes a favorable alternative to baking or ultraviolet curing.

Another use of the invention is to provide an easily modulated electron beam source for lithography. In most electron beam lithography systems the electron beam is at high energy and is not easily turned on (unblanked) and off (blanked). To accomplish blanking in prior art systems the beam is deflected off an aperture in the electron optical column. However, there are drawbacks to this approach since the beam at the target plane moves while blanking occurs causing unwanted anomalies in the patterns being written. In addition the beam's continuous bombardment on the blanking aperture causes contamination and charging of the aperture deflecting the beam and causing errors in positioning of patterns being written. In practicing the present invention, it has been found that, at lower vacuum levels than practiced in prior art systems, electron emission has been achieved by biasing the anode aperture or grid 26, and further that a high energy beam >30 KeV can be turned on and off with just a few (1 to 5) volts variation on the grid. This small voltage on the exit aperture or grid anode has virtually no affect on the beam's landing position. This permits this electron source to be utilized in high resolution electron beam lithography and pattern generation as well as other applications requiring a modulated electron beam such as electron beam testing and inspection of integrated circuit devices.

Figure 5:
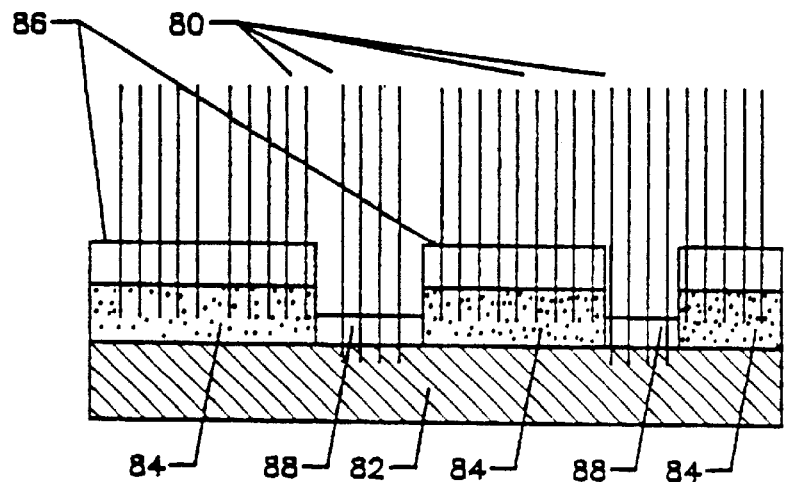
FIG. 5 is a schematic view showing use of the invention in a lift off process.

Another useful application of the disclosed invention is as an aid in lift off processing as used in semiconductor fabrication. Lift off techniques in depositing patterned metal films have become quite widespread in semiconductor processing. As shown in FIG. 5, a substrate 82 to be patterned is coated with a photoresist 84, and exposed and developed using conventional photolithography. The metal to be deposited on the substrate is evaporated or sputtered on top of the resist film 84, as indicated at 86, and directly to the substrate 82 in developed windows in the resist, as indicated at 88. At this point in the process, all that remains is to dissolve the resist remaining, i.e. in areas under the metal at 86, which will leave the metal film at areas 88, in the selected patterned areas only. However, this is the most difficult step in lift off processing, because the metal film covers the resist and keeps the solvent from dissolving the underlying resist. One solution to this problem is to employ a high-power laser to disrupt the metal film over the resist. However, a better technique is to employ the electron source of the present invention. By utilizing a broad area electron beam 80, it is possible to render the underlying resist 84 more soluble by exposing it with the electron beam at an appropriately high energy, such as 30 KeV. In addition to making the underlying resist more soluble, with large exposure doses (200 micro-Coulombs per square centimeter) the metal film 86 tends to blister, allowing a solvent to reach the underlying resist 84 in the subsequent dissolution process step. Although this technique may have been possible using conventional electron beam pattern generation systems, it was not practical because of the large exposure dose required over the entire substrate.

Figure 6:
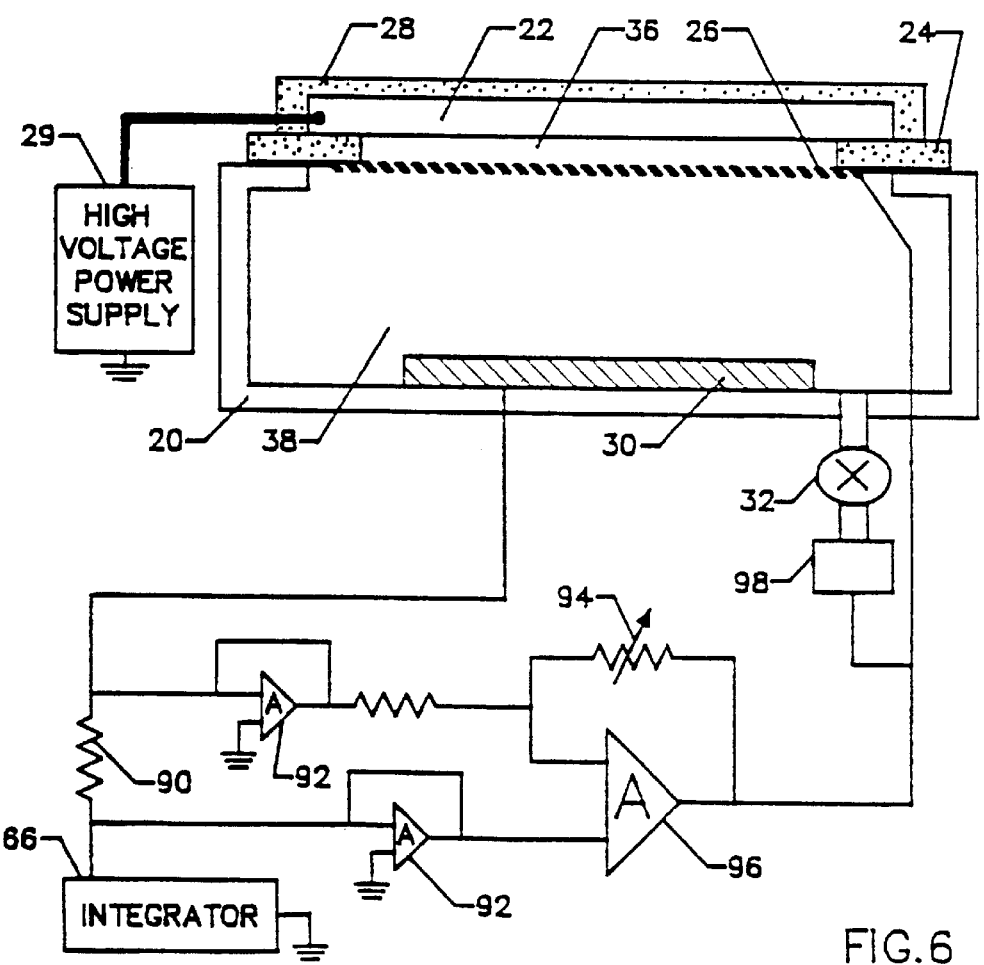
FIG. 6 shows the use of feedback to control beam current.

A further embodiment of this invention is shown in FIG. 6. In some applications it may be desirable to provide a constant beam current at different electron beam energies. For example it may be desirable to expose or cure the upper layer of resist on a resist coated substrate, but not the bottom layer. This can be done by utilizing an electron beam energy low enough such that most of the electrons are absorbed in the upper layer of the resist. Subsequent to curing the top layer, it may be desirable to cure the full thickness of the resist layer. This can be cone by raising the accelerating voltage of electron beam to penetrate completely through the resist layer to the substrate. It would be desirable in performing these exposures to be able to alter the accelerating voltage without causing a change in the emission current. However, if the accelerating voltage is increased it tends to cause more ionization and therefore an increase in beam current. Similarly if the accelerating voltage is lowered, ionization lessens and the beam current is decreased. A means of maintaining a constant beam current independent of changes in accelerating voltage is shown in FIG. 6. The beam current is sampled via a sense resistor 90, which is placed between the target and the integrator 66. Alternatively, the beam current could be sampled at the grid as a portion of the beam is intercepted there. Two unity gain voltage followers 92 buffer the signal obtained across the sense resistor 90 and feed it to an amplifier 96 with adjustable gain 94. The output of this amplifier controls the voltage on the grid anode 26, such that an increase in beam current will cause a decrease in bias voltage on the grid and decrease in emission current from the cathode 26. The gain of the amplifier 96 is adjusted, by means of the variable resistor 94, so that any change in current caused by a change in the accelerating voltage is counteracted by a change in bias voltage to maintain the beam current reaching the target constant. Alternatively, the output of the amplifier 96 can be connected to a voltage controlled variable rate leak valve 98, to counteract changes in emission current by raising or lowering the pressure in the ionization region 38. Further, a wider range of beam current control could be provided by utilizing feedback signals to both the variable leak valve 98 and the grid 26.

Electron beam radiation may take place in any chamber having a means for providing electron beam radiation to substrates placed therein. It is preferred that the electron beam exposing is conducted with a wide, large beam of electron radiation from a large-area electron beam source. Electron beam chambers of the type shown in FIGS. 1–6, which provides a large area electron source, are commercially available from Electron Vision, a unit of AlliedSignal Inc., under the trade name "ElectronCure™". The principles of operation and performance characteristics of such device are described in U.S. Pat. No. 5,003,178, the disclosure of which is incorporated herein by reference. The temperature at which the electron beam exposure chamber operates preferably ranges from about 20° C. to about 600° C., more preferably from about 250° C. to about 450° C. The electron beam energy is preferably from about 0.5 KeV to about 30 KeV, and more preferably from about 3 to about 10 KeV. The dose of electrons which is generated preferably ranges from about 1 to about 100,000 $\mu C/cm^2$ and more preferably from about 50 to about 20,000 $\mu C/cm^2$. Generally, it is preferred that the exposing is carried out at a pressure of from about 1 m Torr to about 100 m Torr. Electron beam exposure may be controlled by setting the beam accelera-tion. The electron beam radiation is controlled such that the electrons range is concentrated at a plane between the upper and lower surfaces of the layer. The gas ambient in the electron beam tool can be any of the following gases: nitrogen, oxygen, hydrogen, argon, a blend of hydrogen and nitrogen, ammonia, xenon, forming gas or any combination of these gases. The electron beam current is preferably from about 1 to about 40 mA, and more preferably from about 5 to about 20 mA. Preferably, the electron beam exposing is conducted with a wide, large beam of electron beam radiation from a uniform large-are electron beam source which covers an area of from about 4 inches to about 256 square inches. The electron beam source can be the cathode 22 or can be another source of electrons emanating from a source 27 between the cathode and the anode as shown in FIG. 1.

The apparatus of FIGS. 1–6 shows a preferred form of the invention which is an electron emission apparatus. The apparatus could just as well be a charged particle device and source 27 could just as well be a charged particle source. In such an event the anode and cathode are electrodes which would be suitable for the charge of the charged particles. The voltage applied to the second electrode (anode 26) is that voltage which attracts the charged particles generated or directed by the first electrode (cathode 22). A suitable means for generating charged particles between the cathode and the anode and means for generating electrons between the cathode and the anode is by generating a plasma of electrons and/or ions via an ENI Model No. ACG-6B RF Generator & Matching Network Model No. MW-10D available from ENI—A Division of Astec America Inc, of Rochester, N.Y.

Figure 7A:
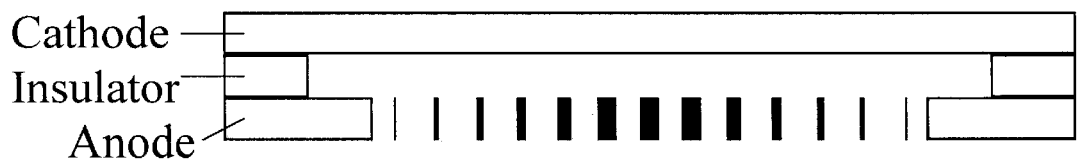
FIGS. 7A–7C show three anode embodiments useful for controlling electron or charged particle beams, respectively varying aperture size; varying thickness of anode; and varying both aperture size and thickness.
Figure 7B:
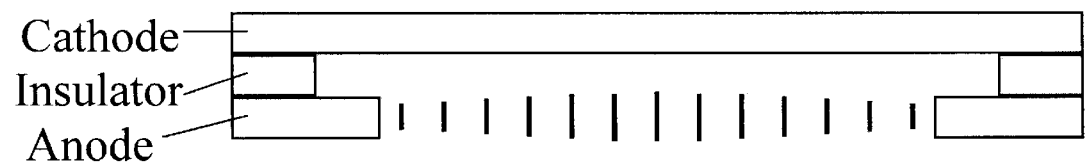
Figure 7C:
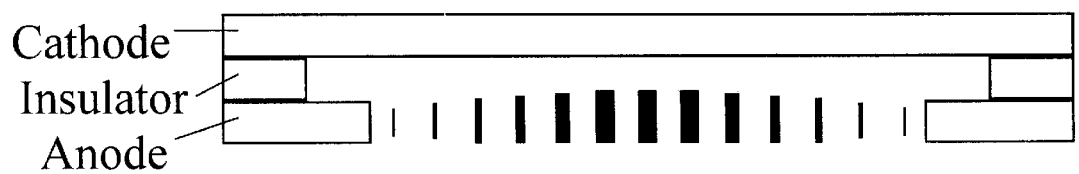

A key feature of the present invention is the use of an anode (second electrode) which corrects for the beam intensity fall-off from center to edge and alters the beam intensity to correct the fall-off from center to edge. There are several embodiments of anodes for accomplishing this. FIG. 7 shows three different anode grids. Embodiment A shows an anode having an array of spaced apart apertures extending from a center of the grid to an edge of the grid having progressively increasing aperture area from the center of the grid to the edge of the grid. Typically, the diameter of the apertures at the edge of the grid are from about 5% to about 25% larger, preferably from about 10% to about 15% larger than the diameter of the apertures at the center of the grid. The most appropriate difference can easily be determined by those skilled in the art. In this method, an anode is made with a lower percentage of open area in the center than there is at the edge. This is done by fabricating the anode with varying hole diameters but maintaining a constant pitch in center to center spacing of the holes from center to edge. This method, which may at first seem straightforward, is actually quite subtle. To compensate for a fall-off in beam current density, there is not a one-to-one relationship between the fall-off in density and the compensation in the variation in the open area of the anode. Due to the mechanism of the generation of the electrons, increasing an anode aperture by a given percentage results in a higher percentage increase in the number of electrons passing through that aperture than would be accounted for by just the area increase alone. This is due to the fact that when one increases the aperture size, more of the accelerating field protrudes through the aperture and pulls more positive ions through the aperture and accelerates them toward the cathode, which generates the primary electron beam. To correct for a 30% fall-off in beam current would require a commensurate variation in open area of the apertures from center to edge. In the fabrication of this grid, a certain wall thickness to hole diameter ratio must be maintained or the grid will loose its mechanical stability. In addition, the wall thickness should not be made too thin due to the fact that there is thermal loading caused by the electron beam impinging on the anode grid. Therefore, one wants enough material to conduct the heat from the center portion of the beam to the heat-sunk flange to which the anode is attached. Therefore, if one desires to provide for a 30% compensation in beam intensity fall-off, one would have to decrease the transmission area of the anode in the center by 30%. This would impact the overall throughput of the system negatively as it would increase the overall exposure time required to deliver the specified dose to the target. However, in this first embodiment of this invention, it has been found that only a 14% variation in area of the holes is required to compensate for a 30% drop-off in beam current from center to edge. Even with this small variation, the fabrication of the anode is difficult due to the larger hole sizes at the edge of the open area of the anode and the small wall thickness between holes. This makes the anode fragile particularly if it is made out of brittle materials.

Surprisingly, one can also alter the current density from center to edge without changing the open area or hole diameters in the anode. By varying the thickness of the anode from center to edge one can increase the number of ions that are pulled through and create the primary beam. To compensate one provides a thinner anode thickness at the edge than in the center. The anode hole in the thinner portion provides less shielding or spill-through of the electrostatic field that is used to accelerate the electrons from the cathode to the anode. Therefore, in the thinner portions of the anode, the field reaches out and pulls more ions in to contribute to the primary beam. Further, the machining or fabrication is simplified in that a constant hole size can be utilized and a varying thickness anode from center to edge is easier to machine. In this regard, Embodiment B shows an anode having an array of spaced apart apertures extending from a center of the grid to an edge of the grid having progressively decreasing thickness from a center of the grid to an edge of the grid. Typically the thickness of the grid at the edge of the grid ranges from about 25% to about 60% less than the thickness of the grid at the center of the grid. The most appropriate thicknesses can easily be determined by those skilled in the art. Embodiment C shows an anode having an array of spaced apart apertures extending from a center of the grid to an edge of the grid having both progressively increasing aperture area from the center of the grid to the edge of the grid and progressively decreasing thickness from a center of the grid to an edge of the grid. In the preferred embodiment, the electrons or other charged particles passing through the anode have a substantially uniform density which varies across the entire anode by less than about 5%, preferably from about 0.1% to about 3%. The most appropriate aperture size difference, thickness and density uniformity can easily be determined and controlled by those skilled in the art. This technique has allowed an improvement in the uniformity of the electron gun described in U.S. Pat. No. 5,003,178 over the full emitting area.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. An electron emission apparatus, comprising:
   (a) a vacuum chamber;
   (b) a large surface area cathode in the vacuum chamber;
   (c) means for applying a negative voltage to the cathode and causing the cathode to issue electrons toward a target in the vacuum chamber;
   (d) an anode spaced apart from the cathode and positioned between the cathode and the target; said anode comprising an electrically conductive grid having an array of spaced apart apertures therethrough extending from a center of the grid to an edge of the grid; said apertures having progressively increasing area from the center of the grid to the edge of the grid, and said grid having a progressively decreasing thickness from a center of a grid to an edge of the grid; and
   (e) means for applying a voltage to the anode which is positive relative to the voltage applied to the cathode.

2. The electron emission apparatus of claim 1 wherein the diameter of the apertures at the edge of the grid are from about 5% to about 25% larger than the diameter of the apertures at the center of the grid.

3. The electron emission apparatus of claim 1 wherein the anode allows the electron density passing through all portions of the anode to vary by about 5% or less.

4. The electron emission apparatus of claim 1 wherein the anode allows the electron density passing through all portions of the anode to vary by from about 1% to about 3%.

5. The electron emission apparatus of claim 1 further comprising means for generating electrons between the cathode and the anode.

6. The electron emission apparatus of claim 1 further comprising means for generating electrons between the cathode and the anode which is an electron plasma generator.

7. The electron emission apparatus of claim 1 wherein means (c) and (e) comprise one or more power supplies.

8. The electron emission apparatus of claim 1 wherein the diameter of the apertures at the edge of the grid are from about 5% to about 25% larger than the diameter of the apertures at the center of the grid.

9. The electron emission apparatus of claim 1 wherein the thickness of the grid at the edge of the grid is from about 25% to about 60% less than the thickness of the grid at the center of the grid.

10. An electron emission apparatus, comprising:
   (a) a vacuum chamber;
   (b) a large surface area cathode in the vacuum chamber;
   (c) means for applying a negative voltage to the cathode in an amount sufficient to drive electrons toward a target in the vacuum chamber;
   (d) an anode spaced apart from the cathode and positioned between the cathode and the target; said anode comprising an electrically conductive grid having an array of spaced apart apertures therethrough extending from a center of the grid to an edge of the grid; said apertures having progressively increasing area from the center of the grid to the edge of the grid ,and said grid having a progressively decreasing thickness from a center of a grid to an edge of the grid ; and
   (e) means for applying a voltage to the anode which is positive relative to the voltage applied to the cathode; and
   (f) means for generating electrons between the cathode and the anode.

11. A charged particle emission apparatus, comprising:

(a) a vacuum chamber;

(b) a first electrode capable of directing charged particles in the vacuum chamber;

(c) means for applying a voltage to the cathode and causing the first electrode to direct charged particles toward a target in the vacuum chamber;

(d) a second electrode spaced apart from the first electrode and positioned between the first electrode and the target; said second electrode comprising an electrically conductive grid having an array of spaced apart apertures therethrough extending from a center of the grid to an edge of the grid; said apertures having progressively increasing areas from the center of the grid to the edge of the grid, and said grid having a progressively decreasing thickness from a center of a grid to an edge of the grid; and (e) means for applying a voltage to the second electrode which attracts the charged particles directed by the first electrode.

12. The charged particle emission apparatus of claim 11 further comprising means for generating charged particles between the cathode and the anode.

13. The charged particle emission apparatus of claim 11 further comprising means for generating charged particles between the cathode and the anode which is an ion plasma generator.

14. A method for producing a highly uniform electron beam emission, comprising:

(a) applying a negative voltage to a large-area cathode positioned in a vacuum chamber, to direct electrons in the vacuum chamber toward a target in the vacuum chamber;

(b) applying a voltage to an anode spaced apart from the cathode and positioned between the cathode and the target, which voltage is positive relative to the voltage applied to the cathode; said anode comprising an electrically conductive grid having an array of spaced apart apertures therethrough extending from a center of the grid to an edge of the grid; said anode having one or both of (i) and (ii):

(i) apertures having progressively increasing area from the center of the grid to the edge of the grid;

(ii) a progressively decreasing thickness from a center of the grid to an edge of the grid.

15. The method of claim 14 further comprising means for generating electrons between the cathode and the anode.

16. A method for producing a highly uniform charged particle emission comprising:

(a) applying a voltage to a large-area cathode positioned in a vacuum chamber and causing the first electrode to direct charged particles toward a target in the vacuum chamber;

(b) applying a voltage to a second electrode spaced apart from the first electrode and positioned between the first electrode and the target; which voltage attracts the charged particles directed by the first electrode; said second electrode comprising an electrically conductive grid having an array of spaced apart apertures therethrough extending from a center of the grid to an edge of the grid; said second electrode having one or both of (i) and (ii):

(i) apertures having progressively increasing area from the center of the grid to the edge of the grid;

(ii) a progressively decreasing thickness from a center of the grid to an edge of the grid.

17. The method of claim 16 further comprising means for generating charged particles between the cathode and the anode.

* * * * *